United States Patent
Choi

(10) Patent No.: US 6,219,798 B1
(45) Date of Patent: Apr. 17, 2001

(54) HOLD-RESET MODE SELECTION COUNTER AND OPERATION METHOD THEREOF

(75) Inventor: Yong-Hwan Choi, Kyungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/210,784

(22) Filed: Dec. 15, 1998

(30) Foreign Application Priority Data

May 25, 1998 (KR) .................................................. 98-18803

(51) Int. Cl.⁷ .................................................. H03K 21/38
(52) U.S. Cl. ............................................ 713/502; 377/107
(58) Field of Search ............................... 713/502; 377/44, 377/64, 107, 110

(56) References Cited

U.S. PATENT DOCUMENTS

| | | | |
|---|---|---|---|
| 5,321,344 | * 6/1994 | Ott et al. ........................... | 318/280 |
| 5,383,230 | * 1/1995 | Fuse et al. ........................ | 377/44 |
| 5,481,581 | * 1/1996 | Jones, Jr. ......................... | 377/55 |
| 5,557,781 | 9/1996 | Stones et al. .................... | 395/550 |
| 5,752,062 | * 5/1998 | Gover et al. ..................... | 714/37 |
| 6,011,500 | * 1/2000 | Noda et al. ...................... | 341/144 |

* cited by examiner

*Primary Examiner*—Thomas M. Heckler
(74) *Attorney, Agent, or Firm*—Fleshner & Kim, LLP

(57) ABSTRACT

A hold/reset mode selection counter includes a counter unit composed of a plurality of counter blocks to perform a counting operation, a mode selection unit that detects a count enable signal length, and a control unit that enables or disables the counter unit. A detection unit generates a signal that holds or pauses the counter unit. The hold/reset mode selection counter controls the counting operation and a reset operation so that the operations are performed only when necessary, and a number of the counter blocks can be reduced. Thus, the hold/reset mode selection counter does not unconditionally perform a counting operation in accordance with an enable signal or perform a circular counting operation.

18 Claims, 6 Drawing Sheets

HOLD-RESET MODE SELECTION COUNTER AND OPERATION METHOD THEREOF

BACKGROUND OF THE INVENTION

1. Field of the Invention

The present invention relates to a counter, and more particularly, to a hold/reset mode selection counter.

2. Background of the Related Art

FIG. 1 is a schematic block diagram of a related art counter. As shown in FIG. 1, a plurality of counter blocks CNT1–CNT5 each has a count input terminal CI receiving a count enable signal CNTEN, a clock input terminal CP receiving an external clock signal CLK and respectively output a decode output value Q0–Q4. The plurality of counter blocks CNT1–CNT5 are connected in series. Each count input terminal CI of the counter blocks CNT1–CNT5 receives a count output signal CO from the previous counter block. In addition, a reset input terminal CDN of each of the counter blocks CNT1–CNT5 is reset by receiving a reset signal RS.

FIG. 2 is a circuit diagram of an ith counter block $CNT(i)$ of the counter blocks CNT1–CNT5 in FIG. 1. The ith counter block $CNT(i)$ is composed of an inverter INV1 inverting a count output signal $CO(i-1)$ from a previous counter block $CNT(i-1)$ a double input multiplexor MUX and a JK flipflop JKF. The JK flipflop JKF has a first input terminal J receiving the count output signal $CO(i-1)$ from the previous counter block $CNT(i-1)$, a second input terminal K receiving an output signal from the inverter INV1, a clock input terminal CP receiving an external clock signal CLK, the reset input terminal CDN receiving the reset signal RS and outputting an output value $Q(i)$. The double input multiplexor MUX is enabled by the count output signal $CO(i-1)$ from the previous counter block $CNT(i-1)$. The double input multiplexor MUX has a first input terminal CI0 connected with ground VSS, a second input terminal CI1 receiving the output value $Q(1)$ from the JK flipflop JFK and outputs a count output signal $CO(i)$.

The operation of the related art counter of FIG. 1 will now be described. First, when the two input terminals J, K of the JK flipflop JKF of the counter block $CNT(i)$ receive different inputs, the JK flipflop JKF holds or transits a previous value at each rising edge of the external clock signal CLK. Thus, when the first and second input terminals J, K of the JF flipflop JKF receive a high-level signal and a low-level signal, respectively, the output value Q is transited. However, when the first and second input terminals J, K of the JF flipflop JKF receive a low-level signal and a high-level signal, respectively, the JF flipflop JKF holds the previous value.

The multiplexor MUX of the counter block $CNT(i)$ generates the count output signal $CO(i)$, which is supplied to the count input terminal CI of a next counter block $CNT(i+1)$. Only when the count output signal $CO(i-1)$ of the previous counter block $CNT(i-1)$ of the counter block $CNT(i)$ is a high level, the output value $Q(i)$ from the counter block $CNT(i)$ is identical to the count output signal $CO(i)$. Thus, when output values from the counter blocks CNT1–CNT5 are [00010], subsequent output values are prevented from becoming [00111], and instead become [00011].

Accordingly, when the count enable signal CNTEN is a high level, the related art counter in FIG. 1 counts from [00000] to [11111] and is reset by the reset signal RS. The related counter counts up to and holds a predetermined count value and waits for a new control signal holding the value. However, as described above, the related art counter has various disadvantages. The related art counter may have a redundant desirable counter value. In addition, the related art counter is not capable of determining whether to continue counting from a suspended point or to restart counting.

The above references are incorporated by reference herein where appropriate for appropriate teachings of additional or alternative details, features and/or technical background.

SUMMARY OF THE INVENTION

An object of the present invention is to provide a counter that substantially obviates at least one of the problems due to the limitations and disadvantages of the related art.

Another object of the present invention is to provide a hold/reset mode selection counter that reduces power consumption by performing a counting operation only when necessary.

Another object of the present invention is to provide a hold/reset mode selection counter that simplifies a circuit by eliminating a redundant counter decode signal and selects an operation mode using a single control signal.

Another object of the present invention is to provide a hold/reset mode selection counter that does not unconditionally count in accordance with an enable signal or perform a circular counting operation.

Another object of the present invention is to provide a hold/reset mode selection counter that performs counting and resetting operations only when necessary and reduces a number of counter blocks.

To achieve at least these objects and other advantages in a whole or in parts and in accordance with the purpose of the present invention, as embodied and broadly described, a hold/reset mode selection counter includes a counter unit performing an actual counting, a mode selection unit detecting a length of a high level state of a count enable signal and resetting the counter unit, a control unit enabling or disabling the counter unit and a detection unit detecting a desirable count value and holding the counter unit.

To further achieve the above objects in a whole or in parts, a counter according to the present invention is provided that includes a counter unit that includes a plurality of counter blocks; a mode selection unit that sets one of a first mode and a second mode of the counter circuit by detecting a control signal; and a control unit that controls the counter unit, wherein the control unit operates the counter unit according to the counter circuit mode when a prescribed counter unit value is reached.

To further achieve the above objects in a whole or in parts, a hold/reset mode selection counter according to the present invention is provided that includes a counter unit that includes a plurality of counter blocks that output an output value; a mode selection unit that outputs a mode selection signal; a control unit coupled to the counter unit and the mode selection unit that enables and disables the counter unit; and a detection unit that detects when the counter reaches a prescribed counter value and outputs a detection signal, wherein the control unit operates the counter unit according to the mode selection signal when the detection signal is received.

To further achieve the above objects in a whole or in parts, a method of operating a counter according to the present invention is provided that includes initiating a counter using a count enable signal; incrementing the counter based on a clock signal; determining whether an output value of the counter equals a prescribed value; repeating the incrementing and determining steps when the output value does not equal the prescribed value, and wherein the counter is held when the output value equals the prescribed value; judging whether a prescribed state of the count enable signal exceeds an interval; and restarting the counter at the prescribed value when the prescribed state of the count enable signal is judged not to exceed the interval, and returning to the initializing step when the prescribed state of the count enable signal exceeds the interval.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
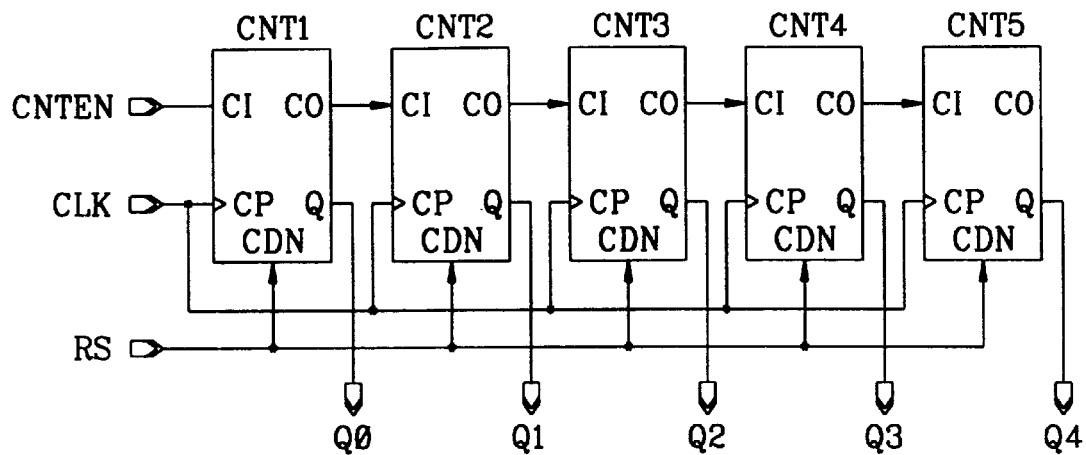
FIG. 1 is a schematic block diagram showing a related art counter.
Figure 2:
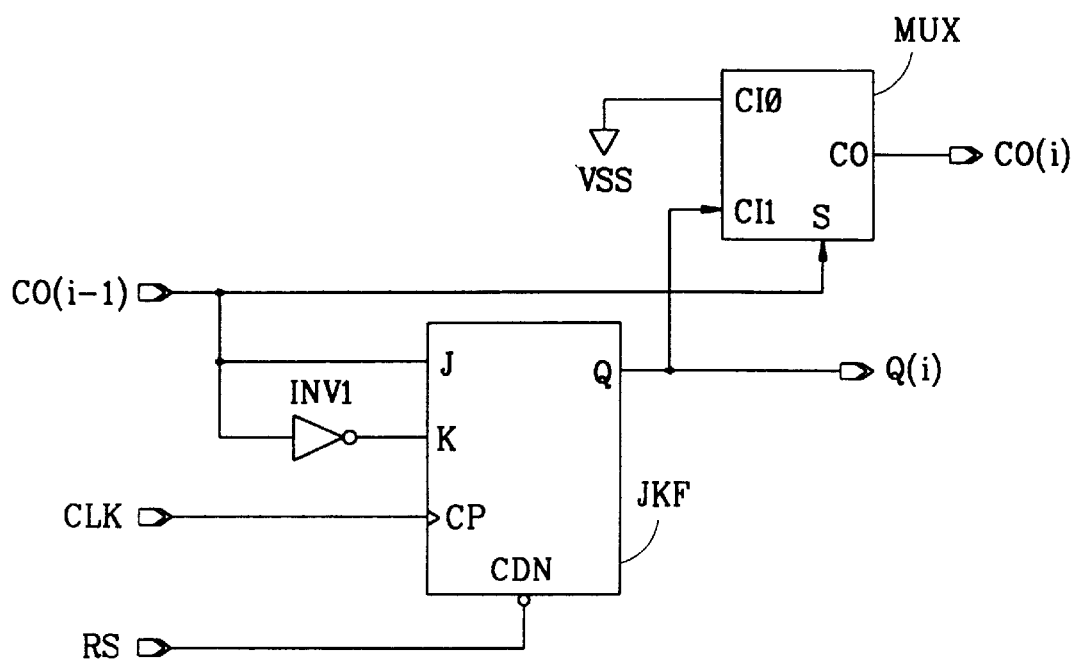
FIG. 2 is a circuit diagram showing a counter block of the counter in FIG. 1.
Figure 3:
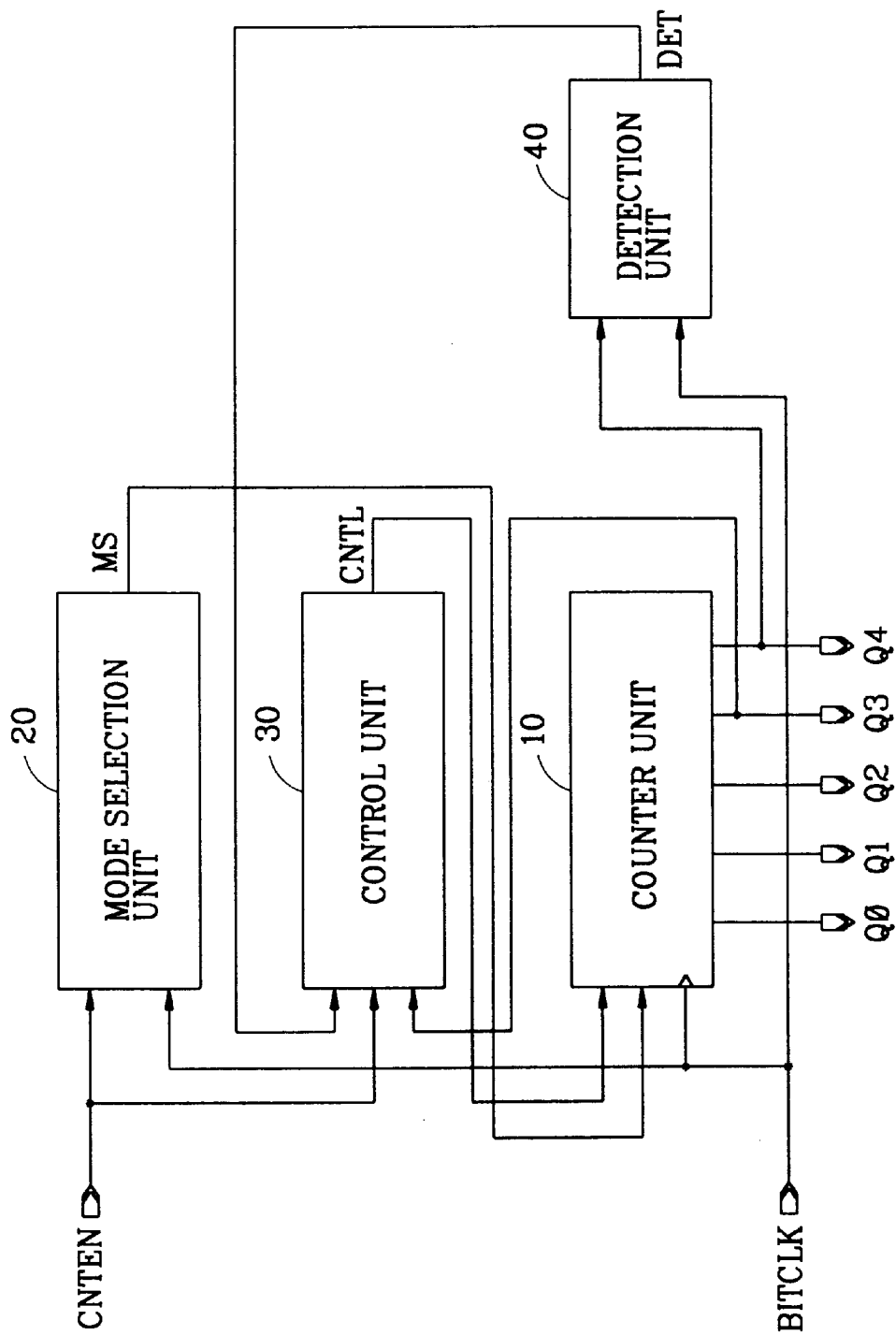
FIG. 3 is a schematic block diagram showing a preferred embodiment of a hold/reset mode selection counter according to the present invention.

FIG. 3 is a schematic block diagram of a first preferred embodiment of a hold/reset mode selection counter according to the present invention. As shown in FIG. 3, the hold/reset mode selection counter includes a counter unit 10 that performs a counting operation, a mode selection unit 20, a control unit 30 and a detection unit 40. The mode selection unit 20 preferably detects a length of a high-level state of a count enable signal CNTEN and resets the counter unit 10. The control unit 30 enables or disables the counter unit 10, and a detection unit 40 detects a prescribed count value to hold the counter unit 10.

Figure 4:
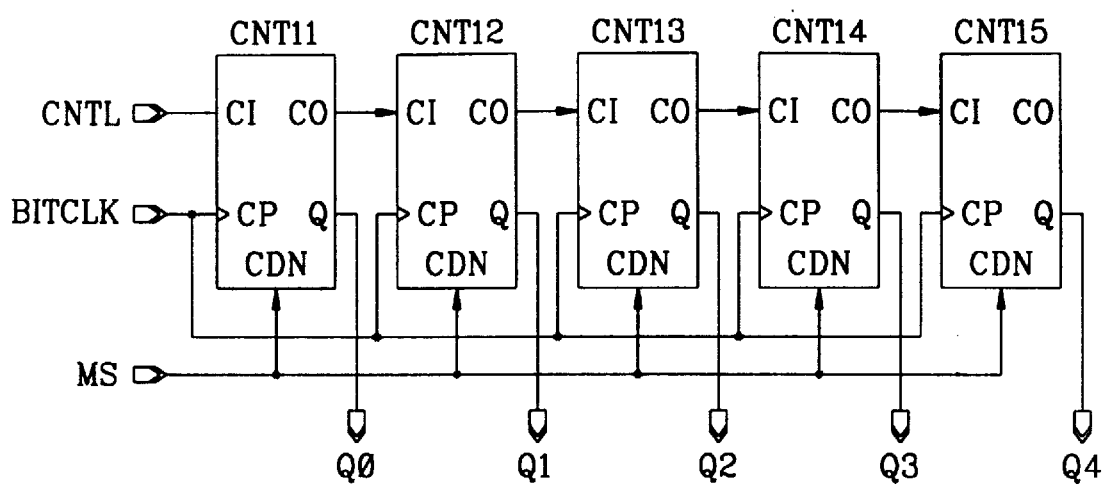
FIG. 4 is a block diagram showing a exemplary counter unit in FIG. 3.

FIG. 4 is a detailed block diagram showing the counter unit 10 with serially coupled first to fifth counter blocks CNT11–CNT15. Each of the counter blocks CNT11–CNT15 has a clock input terminal CP that receives an external clock signal BITCLK, a reset input terminal CDN that receives a mode selection signal MS outputted from the mode selection unit 20 and a count input terminal CI that receives a count output signal CO from the previous counter block. An output signal CNTL from the control unit 30 is preferably provided to the count input terminal CI of the first counter block CNT11 as a count enable signal to enable the counter unit 10.

Figure 5:
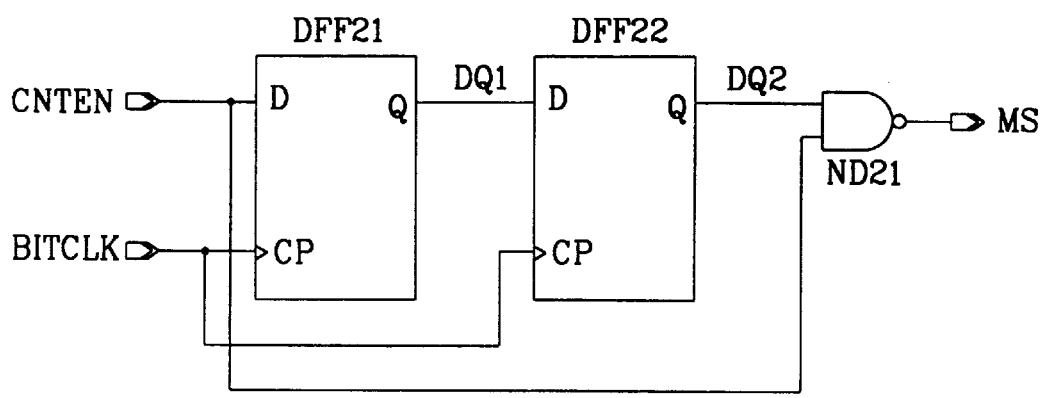
FIG. 5 is a circuit diagram showing a exemplary mode selection unit in FIG. 3.

FIG. 5 is a detailed circuit diagram showing the mode selection unit 20. As shown in FIG. 5, a first D flipflop DFF21 has an input terminal D that receives a count enable signal CNTEN and a clock input terminal CP that receives the clock signal BITCLK. A second D flipflop DFF22 has an input terminal D that receives an output signal DQ1 from the first D flipflop DFF21 and a clock input terminal CP that receives the clock signal BITCLK. A NAND gate ND21 NANDs an output signal DQ2 from the second D flipflop DFF22 and the count enable signal CNTEN.

Figure 6:
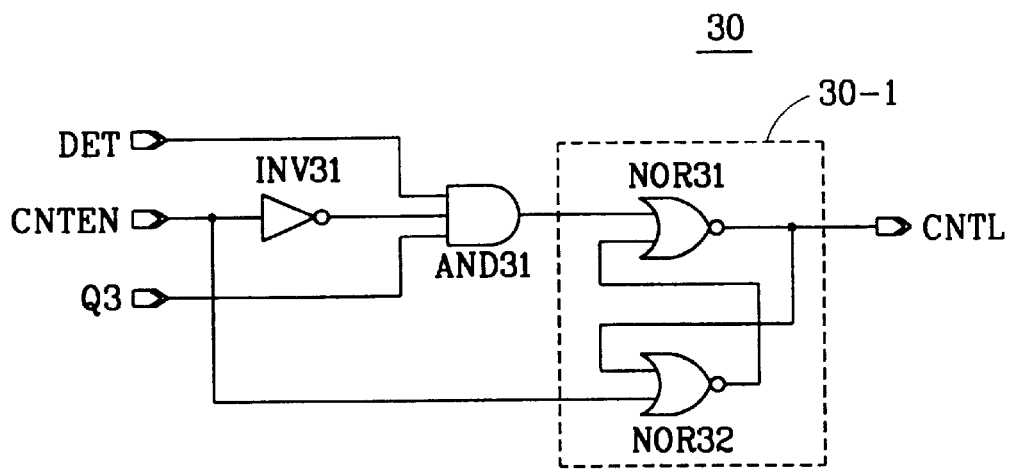
FIG. 6 is a circuit diagram showing a exemplary control unit in FIG. 3.

FIG. 6 is a detailed circuit diagram showing the control unit 30. As shown in FIG. 6, the control unit 30 includes an inverter INV31 that inverts the count enable signal CNTEN, and an AND gate AND31 that ANDs an output signal from the inverter INV31, an output signal DET from the detection unit 40 and preferably an output signal Q3 from the fourth counter block CNT14 of the counter unit 10. A latch unit 30-1 latches an output signal from the AND gate AND31. The latch unit 30-1 preferably includes a RS latch having a first NOR gate NOR31 with an input terminal that receives an output signal from the AND gate AND31 of the control unit 30 and a second NOR gate NOR32 with an input terminal that receives the count enable signal CNTEN. Each output from the first and second NOR gates is inputted to the other input terminal of the second and first NOR gates, respectively.

Figure 7:
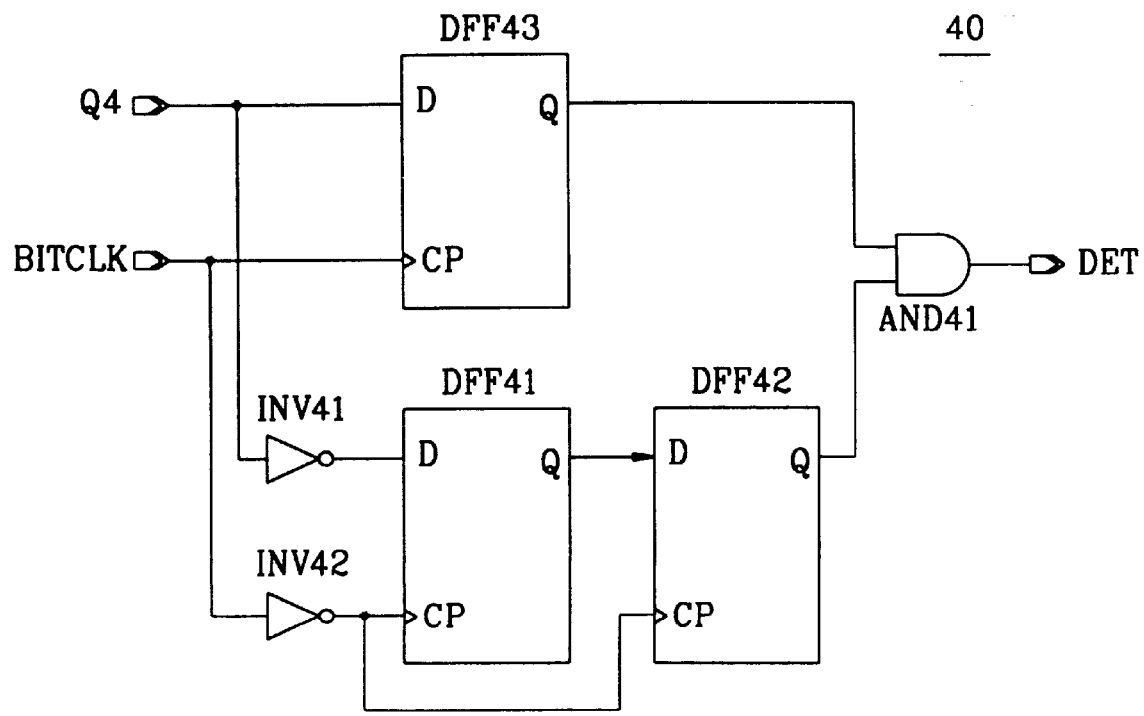
FIG. 7 is a circuit diagram showing a exemplary detection unit in FIG. 3.
Figure 8:
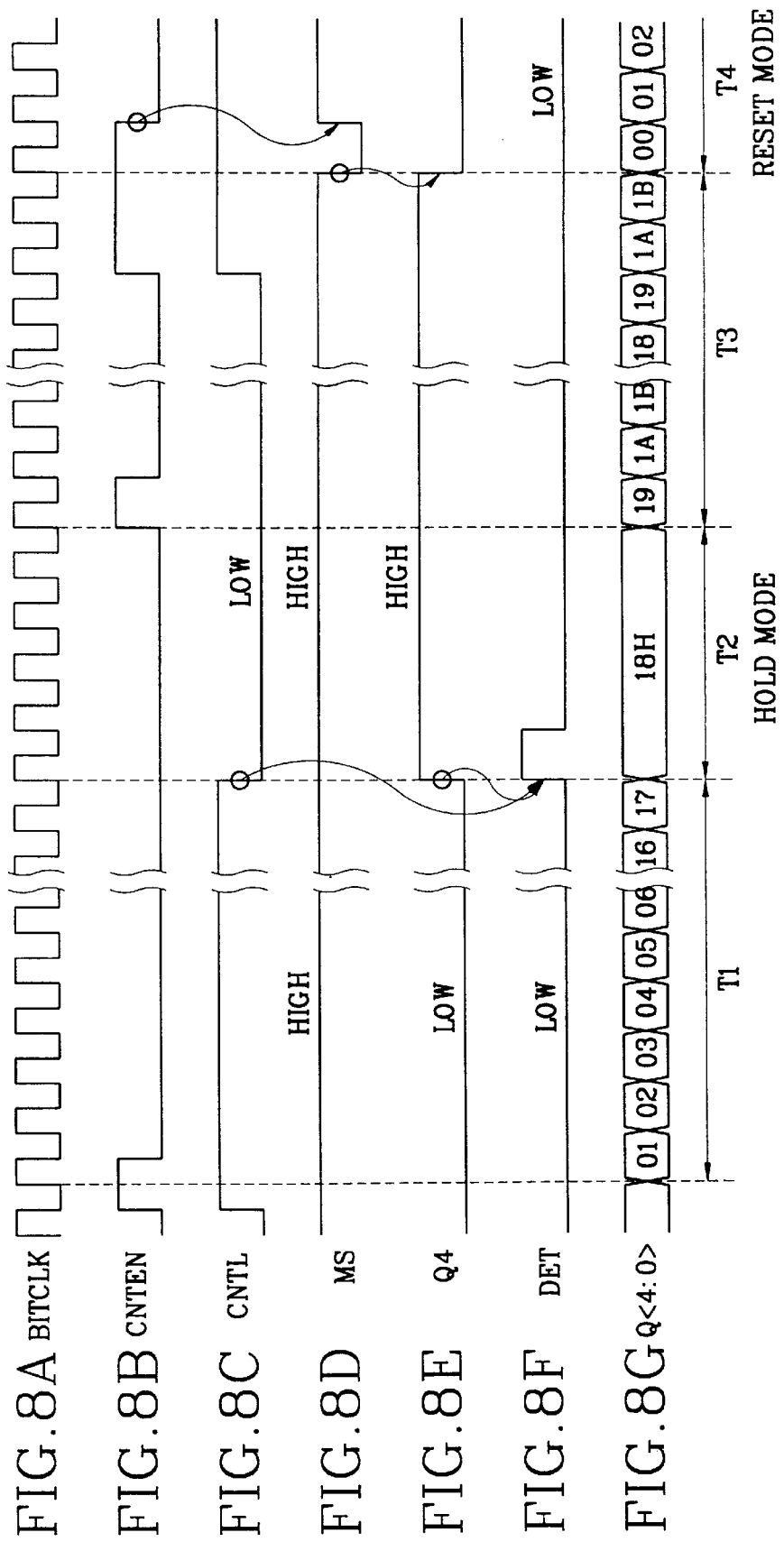
FIGS. 8A through 8G are timing diagrams showing signal waveforms in FIG. 3.

FIG. 7 is a detailed circuit diagram showing the detection unit 40. As shown in FIG. 7, the detection unit 40 includes a first inverter INV41 that preferably inverts an output signal Q4 from the fifth counter block CNT15 of the counter unit 10, and a second inverter INV42 that inverts the external clock signal BITCLK. A first D flipflop DFF41 has a clock input terminal CP that receives an output signal from the second inverter INV42 and an input terminal D that receives an output signal from the first inverter INV41. A second D flipflop DFF42 has a clock input terminal CP that receives the output signal from the second inverter INV42 and an input terminal D that receives an output signal from the first D flipflop DFF41. A third D flipflop DFF43 has a clock input terminal CP that receives the external clock signal BITCLK and an input terminal D that preferably receives the output signal Q4 from the fifth counter block CNT15 of the counter unit 10. An AND gate AND41 ANDs output signals from the second and third D flipflops DFF43, DFF42.

Operations of the first preferred embodiment of the hold/reset mode selection counter according to the present invention will now be described. The count enable signal CNTL is inputted to the first counter block CNT11 of the counter unit 10 to start the counting operation. When an output Q<4:0> from the counter unit 10 is a prescribed value, for example [11000], the counter unit 10 suspends the counting operation and holds a current value awaiting a new control signal. In this state, a system using the preferred embodiment of the counter of the present invention may perform other operations. However, the present invention is not intended to be so limited. For example, the prescribed value can be values other than Q<4:0> equal to [11000].

Next, the control unit 30 applies the count enable signal CNTL to the counter unit 10 when necessary to operate the counter unit 10. In particular, when a high-level state of the count enable signal CNTEN preferably exceeds two clock cycles of the clock signal BITCLK, the counter unit 10 is reset and restarts counting. However, if the count enable signal CNTEN does not exceed two clock cycles of the clock signal BITCLK, the counter unit 10 preferably resumes counting from the previous (e.g., prescribed) value.

FIGS. 8A through 8G are diagrams showing exemplary timing waveforms of signals in FIG. 3. When the count enable signal synchronized with the external clock signal BITCLK is applied at a first interval T1, the latch unit 30-1 of the control unit 30 is set and outputs an output signal CNTL at a high level to the counter unit 10. Thus, the first counter block CNT11 of the counter unit 10 is enabled and starts count operation.

When an output value Q<4:0> from the counter unit 10 is a desired or prescribed count value [11000], for example [H18] in hexadecimal notation, the AND gate AND 31 in the control unit 30 receives the count enable signal CNTEN, which is inverted to a high level by the inverter INV31, the output signal Q3 from the fourth counter block CNT14 and the output signal DET from the detection unit 40. In this example, the output from the fifth counter block CNT15 of the counter unit 10 is supplied to the D flipflops DFF41, DFF43 of the detection unit 40, and thus the detection unit 40 outputs the signal DET at the high level.

Accordingly, when the high-level signal DET supplied from the detection unit 40, the count enable signal CNTEN, which has been inverted to the high level by the inverter INV31, and the output value Q3 from the fourth counter block CNT14 of the counter unit 10 are supplied to the AND gate AND31 of the control unit 30, and the AND gate AND31 outputs the high-level signal to the latch unit 30-1. The control signal CNTL is outputted at a low level to the counter unit 10, and the operation of the counter is suspended and converted to a hold mode that holds a current (e.g., desired) counter value.

In a third interval T3, when the high-level state of the count enable signal CNTEN is shorter than preferably two clock cycles of the external clock signal BITCLK, the count enable signal CNTEN is inverted by the inverter INV31 and becomes a low level. The latch unit 30-1 receives a low-level signal from the AND gate AND31 of the control unit 30. Thus, the latch unit 30-1 is reset and resumes the counting operation. The mode selection signal MS, which is the output signal from the mode selection unit 20, maintains the high level like the second interval T2. The count resume operation is caused by the count enable signal CNTEN, which is inputted to the NAND gate ND21 of the mode selection unit 20, being shorter in length than two clock cycles of the external clock signal, and the output signal DQ2 from the second D flipflop DFF22 is not set at the high-level state. In particular, the signal outputted from the mode selection unit 20 continually maintains the high level, and the latch unit 30-1 of the control unit 30 is reset. Accordingly, the counter unit 10 restarts the counting operation from the value held in the second interval T2.

In a fourth interval T4, during the counting operation, when the high-level state of the count enable signal CNTEN exceeds the two clock cycles of the external clock signal BITCLK, the mode selection signal MS supplied from the mode selection unit 20 becomes a low level. Thus, the counter is cleared and converted to a reset mode in which the counter operates from [00H].

Figure 9:
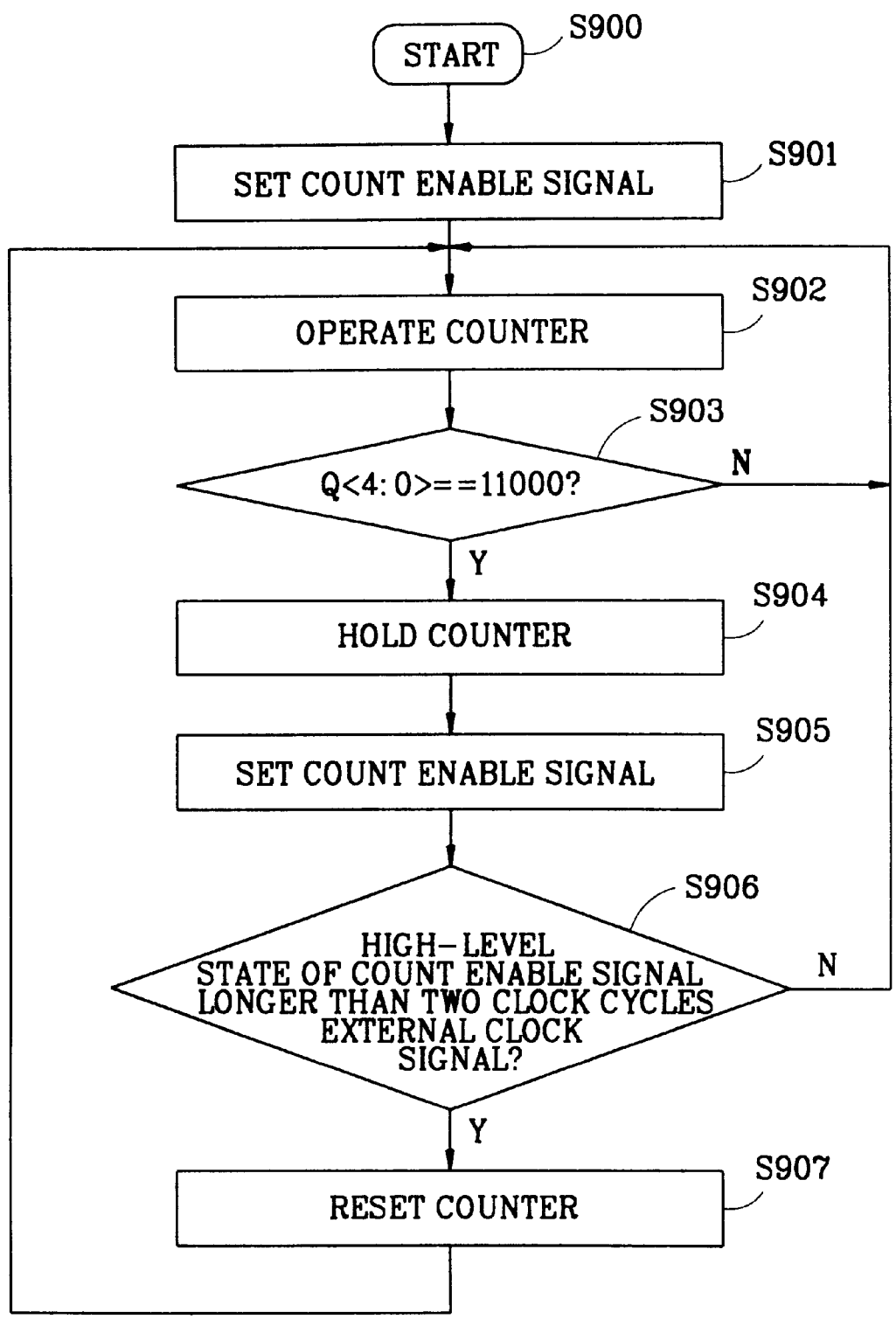
FIG. 9 is a flowchart illustrating a preferred embodiment of a method for operating the hold/reset mode selection counter according to the present invention.

FIG. 9 is a flowchart illustrating a second preferred embodiment of a method for operating a counter circuit according to the present invention. The preferred embodiment of a method for operating a counter can be used, for example, to operate the hold/reset mode selection counter shown in FIG. 3. As shown in FIG. 9, the process begins at step S900 where control continues to step S901 in which a count enable signal is set. From step S901, control continues to step S902 where the counter performs the count operation. From step S902 control continues to step S903. In step S903, the counter determines whether the output value Q<4:0> from a counter unit such as counter unit 10 is a prescribed value, for example [11000]. When the output value Q<4:0> from the counter unit 10 is determined not to equal the prescribed value [11000] in step S903, control returns to step S902. Otherwise, from step S903, control continues to step S904 where the counter is held when the output value Q<4:0> from the counter unit 10 is determined in step 5903 to be identical to the prescribed value [11000].

From step S904, control continues to step S905 where a count enable signal such as CNTEN is set. From step S905, control continues to S906 where the counter determines whether the high-level state of the count enable signal CNTEN exceeds for example two clock cycles of an external clock signal BITCLK. When the high-level count enable signal CNTEN does not exceed two clock cycles, control, returns to step S902 where the count operation is performed from the prescribed value, which has been held in step S904. When the high-level state of the count enable signal CNTEN is determined in step S906 to exceed the two clock cycles of the external clock signal BITCLK, control continues to step S907 where the counter is cleared, and control returns to step S902 to restart the counting operation from the initial state.

As described above, the preferred embodiments of a hold/reset counter and method according to the present invention have various advantages. Since the hold/reset mode selection counter according to the preferred embodiments performs a counting operation only when necessary, power consumption is reduced. Further, the preferred embodiments of the counter and method eliminate the redundant count decode signal. Thus, the number of logic gates can be reduced. In addition, the preferred embodiments of the counter and method can select the operation mode using the single control signal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A counter circuit, comprising:
   a counter that includes a plurality of counter blocks;
   a mode selector coupled to the counter that sets one of a first mode and a second mode of the counter circuit by detecting a control signal; and
   a controller coupled to the counter that controls the counter, wherein the controller operates the counter according to the counter circuit mode received by the counter when a prescribed counter value is reached.

2. The counter circuit of claim 1, wherein the mode selector sets the counter circuit mode using a single count enable signal.

3. The counter circuit of claim 1, wherein the controller comprises:
   a control circuit; and
   a detector that detects when the counter reaches the prescribed counter value, wherein the controller operates the counter according to one of a hold mode and a reset mode when the prescribed counter value is reached, and wherein each of the plurality of counter blocks outputs part of a decode output value.

4. A hold/reset mode selection counter, comprising:
a counter unit that includes a plurality of counter blocks that output an output value;
a mode selection unit coupled to the counter unit that outputs a mode selection signal to the counter unit;
a control unit coupled to the counter unit that enables and disables the counter unit; and
a detection unit coupled to the control unit that detects when the counter unit reaches a prescribed counter value and outputs a detection signal to the control unit, wherein the control unit operates the counter unit according to the mode selection signal received by the counter unit when the detection signal is received.

5. The counter of claim 4, wherein the mode selection unit sets the counter unit mode using a first control signal.

6. The counter of claim 5, wherein when a high-level state of the first control signal exceeds a prescribed duration, the counter unit is reset and the control unit applies a second control signal to restart the counting operation, and wherein when the high-level state of the control signal does not exceed the duration, the counter unit is held and the control unit restarts the counter unit from the prescribed counter value.

7. The counter of claim 4, wherein the mode selection unit detects a count enable signal to set the counter mode to one of a hold mode and a reset mode.

8. The counter of claim 4, wherein the plurality of counter blocks are coupled in series, wherein each of the counter blocks has a count input terminal and a count output terminal, wherein the count input terminal receives a count output signal from a count output terminal of a preceding counter block, and wherein the count input terminal of a first counter block of the plurality of counter blocks receives an output signal from the control unit to initiate a count operation.

9. The counter of claim 8, wherein said each of the counter blocks further comprises a clock input terminal that receives a clock signal and a reset input terminal that receives a mode selection signal from the mode selection unit.

10. The counter of claim 4, wherein the mode selection unit comprises:
a first flipflop that has an input terminal that receives a count enable signal and a clock input terminal that receives a clock signal;
a second flipflop that has an input terminal that receives a data output signal from the first flipflop and a clock input terminal that receives the clock signal; and
a logic circuit that logically processes a data output signal from the second flipflop and the count enable signal to output the mode selection signal.

11. The counter of claim 10, wherein the first and second flipflops are D flipflops and the logic circuit is a NAND-gate.

12. The counter of claim 10, wherein the detection unit comprises:
a first logic gate that logically processes an output value from at least one first selected counter block of the counter unit;
a second logic gate that logically processes a clock signal;
a third flipflop that has a clock input terminal that receives an output signal from the second logic gate and an input terminal that receives an output signal from the first logic gate;

a fourth flipflop that has a clock input terminal that receives the output signal from the second logic gate and an input terminal that receives an output signal from the third flipflop;
a fifth flipflop that has a clock input terminal that receives the clock signal and an input terminal that receives the output value from the at least one first selected counter block; and
a third logic gate that logically processes output signals from the fourth and fifth flipflops.

13. The counter of claim 12, wherein the control unit comprises:
a fourth logic gate that logically processes the count enable signal;
a fifth logic gate that logically processes an output signal from said fourth logic gate, the detection signal and an output signal from at least one second selected counter block of the counter unit; and
a latch unit that latches an output signal from said fifth logic gate.

14. The counter of claim 4, wherein the control unit comprises:
a first logic gate that logically processes the count enable signal;
a second logic gate that logically processes an output signal from said first logic gate, the detection signal and an output signal from at least one selected counter block of the counter unit; and
a latch unit that latches an output signal from said second logic gate.

15. The counter of claim 14, wherein said latch unit comprises:
a third logic gate that has one input terminal that receives the output signal from said second logic gate; and
a fourth logic gate having one input terminal that receives the count enable signal, wherein the other input terminals of the third and fourth logic gates are respectively connected to an output terminal of fourth and third logic gates, and wherein the first through fourth logic gates are an inverter, a NAND and NOR logic gates, respectively.

16. The counter of claim 4, wherein the detection unit comprises:
a first logic gate that logically processes an output value from at least one selected counter block of the counter unit;
a second logic gate that logically processes a clock signal;
a first flipflop that has a clock input terminal that receives an output signal from the second logic gate and an input terminal that receives an output signal from the first logic gate;
a second flipflop that has a clock input terminal that receives the output signal from the second logic gate and an input terminal that receives an output signal from the first flipflop;
a third flipflop that has a clock input terminal that receives the clock signal and an input terminal that receives the output value from the at least one selected counter block; and
a third logic gate that logically processes output signals from the second and third flipflops.

17. A method for operating a counter, comprising:
  initializing a counter using a count enable signal;
  incrementing the counter based on a clock signal;
  determining whether an output value of the counter equals a prescribed value;
  repeating the incrementing and determining steps when the output value does not equal the prescribed value, wherein the counter is held when the output value equals the prescribed value;
  judging whether a prescribed state of the count enable signal exceeds an interval; and
  restarting the counter at the prescribed value when the prescribed state of the count enable signal is judged not to exceed the interval, and returning to the initializing step when the prescribed state of the count enable signal exceeds the interval.

18. The method of claim 17, wherein the prescribed state is a high level, and wherein the interval is two clock cycles of the clock signal.

* * * * *